United States Patent [19]

Rose

[11] Patent Number: 4,820,371
[45] Date of Patent: Apr. 11, 1989

[54] APERTURED RING FOR EXHAUSTING PLASMA REACTOR GASES

[75] Inventor: Alan D. Rose, Wylie, Tex.

[73] Assignee: Texas Instruments Incorporated, Dallas, Tex.

[21] Appl. No.: 132,306

[22] Filed: Dec. 15, 1987

[51] Int. Cl.⁴ .......................... B44C 1/22; C23C 14/00
[52] U.S. Cl. .................................... 156/345; 118/50.1; 118/620; 118/728; 156/643; 156/646; 204/298
[58] Field of Search ................. 118/728, 50.1, 620; 204/192.12, 192.32, 192.3, 298; 156/345, 643, 646; 427/38, 39

[56] References Cited

U.S. PATENT DOCUMENTS

| | | | |
|---|---|---|---|
| 4,209,357 | 6/1980 | Gorin et al. | 156/345 X |
| 4,534,816 | 8/1985 | Chen et al. | 156/643 X |
| 4,579,618 | 4/1986 | Celestino et al. | 156/345 |
| 4,590,042 | 5/1986 | Drage | 156/345 X |

Primary Examiner—William A. Powell
Attorney, Agent, or Firm—Joseph E. Rogers; James T. Comfort; Melvin Sharp

[57] ABSTRACT

An annular ring (38) adapted for use in a plasma reaction chamber. The annular ring (38) includes a central opening aperture for laterally retaining a semiconductor slice (40) within the chamber. Spaced around the ring are a plurality of gas exhaust ports (58) for providing a back pressure within the chamber, for removing gases therefrom. Different rings can be provided with different central opening apertures to accommodate the processing of different sized slices. Alternative arrangements of the ring (38) provide for mask openings (68) to mask selected areas of the slice (40) and prevent plasma reactions thereat.

18 Claims, 2 Drawing Sheets

─◯─◯─◯─ 2.5 INCH APERTURE
─△─△─△─ 4.3 INCH APERTURE
─□─□─□─ NO APERTURE

APERTURED RING FOR EXHAUSTING PLASMA REACTOR GASES

RELATED APPLICATIONS

"Gas Dispersion Disk for Use in Plasma Enhanced Chemical Vapor Deposition Reactor", by Alan D. Rose, Ser. No. 132,305 filed Dec. 15, 1987..

TECHNICAL FIELD OF THE INVENTION

The present invention relates in general to chemical vapor deposition apparatus, and more particularly relates to plasma enhanced chemical vapor deposition reactors.

BACKGROUND OF THE INVENTION

The fabrication of semiconductor circuits has been greatly facilitated by the use of plasma reactors, and similar equipment. In fabricating semiconductor integrated circuits, such equipment is employed for depositing layers or films of conductive material, semiconductor material or insulating materials in various patterns and configurations to form microcircuits. Dry etching of semiconductor materials can also be conducted with chemical vapor transport systems to selectively remove desired areas of such materials. Generally, a number of identical and individual integrated circuits are fabricated on a circular semiconductor wafer or slice. Well-known batch reactors are constructed to accommodate a number of such slices, of any size, in a single reaction chamber and thereby simultaneously perform the material deposition or etching of all the slices.

More recently, single slice processing reactors have been developed to increase the product uniformity in accordance with current advanced semiconductor processes. The small chamber of a single slice reactor enables easier control of the operating variables, such as gas flow and energy distribution, than the larger chambers of the multi-slice batch reactors. However, with such reactors, only a slice of one size can be processed. For processing different size slices, major changes in the hardware of the reactor is required. Single slice reactors are frequently characterized by undesirable pressure and flow gradients within the single slice reactor especially in the vicinity of the slice, due to the close proximity to the slice of the reactor chamber vacuum ports and the injection nozzles. This condition necessitates the utilization of equipment for controlling such gradients.

Conventional single slice reactors, such as the type disclosed in U.S. Pat. No. 4,534,816, are constructed with plasma reaction chamber apparatus which is adapted for processing slices of only one size. The processing of different size slices, such as two inch, four inch or six inch slices, required different reactors, or increased labor costs in changing the reactor apparatus to accommodate the processing of all such slices.

Heretofore, shower head apparatus has been utilized for dispersing the reactant gases over the slice so as to provide a uniform flow thereover. Notwithstanding, such shower head equipment does not address the problems of the nonuniform distribution of gases in the plasma due to the location of vacuum ports through which the spent gas is withdrawn from the reaction chamber. With such shower head apparatus, nonuniformity in the material deposition or etch rate may occur during the chemical vapor transport process. Conventional single slice, parallel electrode reactors inject reactant gases into the reaction chamber through one of the noted electrodes. Sintered stainless steel disks having a uniformly porous structure comprise such electrodes, and pressure gradients are employed to force the diffusion of gases through such electrode. More commonly, nonporous disks having uniformly spaced holes therein are utilized as the electrode structure. This type of apertured disk is common in many plasma reactors in current use today. The noted U.S. Pat. discloses such a plasma reactor with an apertured electrode disk having uniformly spaced and sized holes formed therein.

The plasma reactor of the noted patent relies on the injection of a gas and two pressure drops therein for ensuring uniformity of flow. The first pressure drop occurs across a baffle upstream from the electrode which produces the second pressure drop. With this structure, it is attempted to inject the gas uniformly over the entire surface of the slice, without addressing the radial nonuniformities which form as the gas is evacuated around the circumference of the slice. The flow is therefore radially nonuniform from the center of the slice to the circumferential edge thereof. The disadvantage of this radial outward flow is the nonuniformity of various process parameters which occur due to the pressure gradient existing over the surface of the slice. As a result, the deposition of a layer of material in the center of the slice may be thicker than that which is deposited near the edge of the slice. The various integrated circuits fabricated on the slice may then exhibit different electrical characteristics.

From the foregoing, it can be seen that a need exists for an improved plasma reactor constructed to provide the flexibility for accommodating numerous size slices with simple and economical changeovers. A need also exists for an improved plasma reactor which provides a uniform dispersion of plasma gases over the surface of the slice to thereby provide an overall uniform depth of material deposited or etched therefrom. A further need exists for apparatus for use with plasma reactors for providing a uniform distribution of plasma gases in a desired pattern so that material is deposited only on selected surfaces of the slice.

SUMMARY OF THE INVENTION

In accordance with the present invention, the disclosed chemical vapor reactor apparatus and methods substantially reduce or eliminate the disadvantages and shortcoming associated with the prior art techniques. According to the invention, there is disclosed an apertured annular ring which encircles a slice and efficiently evacuates the gases from the chamber so that a uniform distribution of material is achieved. The annular apertured ring is a dielectric and maintains a predetermined spaced relationship between a slice holder and a collimator assembly. The technical advantage of this arrangement is that a flow resistance is established to induce a uniform film thickness, while yet limiting the area of deposition so that nonuseable peripheral areas of the slice or the reaction chamber do not react with the plasma gases to form deposits at such locations.

The annular apertured ring can be constructed with varying inside diameters to accommodate various size slices, and to center the slice appropriately within the reaction chamber. Hence, by utilizing different annular rings, which are easily interchangeable, various size slices can be processed with the same plasma reactor.

Because the annular apertured ring is nonconductive, no plasma reaction occurs adjacent the ring.

The annular ring also includes a number of holes spaced around the peripheral edge thereof for providing an exhaust outlet for the plasma gases, while yet maintaining a flow resistance to the gases to produce uniform material layer deposits on the slice.

In the alternative forms of the invention, the annular apertured ring is constructed with an inner opening which does not encircle the slice, but which covers selected portions of the slice to prevent the deposition of material thereon. With such a deposition masking capability, only selected areas of the slice are exposed to the plasma reaction and can be either etched or deposited with a film of material.

The annular apertured ring functions in cooperation with a gas dispersion disk for counteracting the natural pressure gradients arising within the reactor chamber so that a uniform deposit or removal of material can be achieved over the entire surface of the semiconductor slice. A highly important technical advantage of the invention is that product consistency is achieved, in that uniform layers of material can be deposited, or etched, from the surface of the slice. Each of the many chips of a slice is thus more identical in physical construction and electrical operation. The gas dispersion disk of the invention is apertured in accordance with the pressure gradients within the reactor chamber so that in chamber areas where there is a high pressure, the density of holes in the disk is less than at other chamber areas where the pressure is less. The technical advantage of this feature is that the gas which does pass through the apertured disk is uniform in distribution when it is exposed to the semiconductor slice.

BRIEF DESCRIPTION OF THE DRAWINGS

Further features and advantages will become apparent from the following and more particular description of the preferred embodiment of the invention, as illustrated in the accompanying drawings, in which like reference characters generally refer to the same or similar parts or elements throughout the views, and in which.

DETAILED DESCRIPTION OF THE INVENTION

Figure 1:
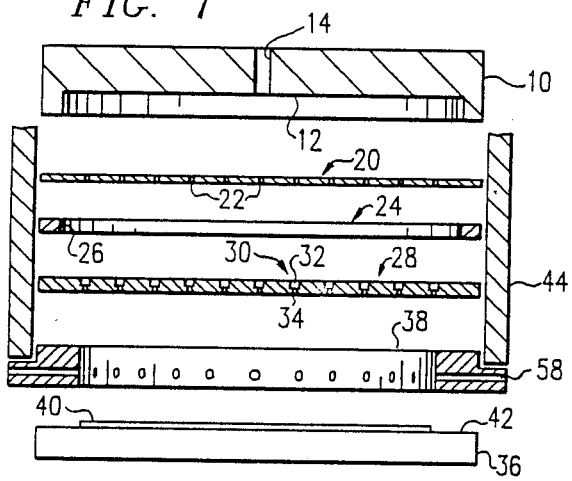
FIG. 1 is a simplified sectional view of a portion of a single slice chemical vapor transport reactor in which semiconductor slices are individually processed.

FIG. 1 illustrates in simplified form the basic components of a chemical vapor transport reactor which are associated with the reaction chamber of the invention. While the present invention is described in terms of a plasma reactor, the principles and concepts apply equally as well to chemical vapor deposition reactors. In addition, the invention can be utilized with equal advantage for depositing uniform layers of a film of material on a semiconductor substrate, or for removing uniform layers of material by dry etching.

The primary elements of the reactor chamber comprise an upper electrode 10 having a recessed area 12 and a gas inlet port 14. While not shown, the electrode 10 may include an exterior water jacket for cooling purposes, and connections to which radio frequency (RF) power can be connected to establish a plasma reaction. The upper electrode 10 is typically constructed of a conductor for carrying the RF energy.

The vapor transport system of the invention further includes a gas dispersion plate 20. While not shown, gas routed through the inlet 14 of the electrode 10 is distributed to each of the holes 22 of the dispersion plate 20. The gas dispersion disk 20 is spaced from the recess 12 of the upper electrode 10 by abutment with the lower annular projection on the upper electrode 10. The gas dispersion disk 20 can be constructed of a rigid material, such as aluminum. To be described in more detail below, the hole or aperture area per unit of disk area of the gas distribution disk 20 varies in correspondence with the pressure gradients within the reactor chamber. With this arrangement, there is achieved a uniform deposition of material, or the etching of a material from the slice.

The reactor apparatus also includes a spacer 24 which is torus shaped with a large central opening 26. The spacer 24 functions to maintain the gas dispersion disk 20 spaced a predetermined distance away from a shower head electrode 28. The shower head electrode 28 has a number of holes 30, each constructed in a stepped manner so as to provide a large diameter hole 32 and a smaller diameter hole 34. The holes 30 in the shower head electrode 28 are all substantially the same size, and evenly distributed over the surface of the shower head electrode 28. The shower head electrode 28 is of conventional construction.

Fixed between the shower head electrode 28 and a slice holder 36 is an apertured annular ring 38 for providing an outlet of the gas vapors from the reactor chamber. A semiconductor slice 40 is fixed by means not shown to the top surface 42 of the slice holder 36, and is thereby exposed to the gas vapors passing through the shower head 28. The slice holder 36 is essentially a counter-electrode which is conductive to RF energy, thereby also causing the slice 40 to conduct such energy and develop a plasma in the chamber. In practice, the slice holder 36 is grounded.

The shower head electrode 28, and all elements sandwiched thereabove are fastened to the electrode 10 by a jar lid type of threaded fastener (not shown). It can be appreciated that such a fastener is essentially a threaded annular fastener with a flange engageable with the shower head electrode 28 for clamping the assembly to the upper electrode 10. (The apertured annular ring 38 can also be fastened to the reactor by the fastener, or by any other conventional technique.)

A cylindrical collimator 44 is provided to house the illustrated apparatus of the reactor, and is constructed of an electrically insulating dielectric to prevent arcing. The collimator 44 functions to confine the plasma to the reaction chamber. In accordance with the invention, the apertured annular ring 38 also functions to maintain the plasma reaction close to the slice 40 by being made of an insulator and fitted closely around the edge of the slice 40. The apertured annular ring 38 is also constructed with a radial hole or aperture pattern to exhaust the reactor gases and provide a flow resistance thereto for inducing a uniform pressure across the slice 40.

With the noted reactor apparatus, chemical vapors are introduced into the reactor chamber through the electrode gas inlet 14 and passed through the gas dispersion disk 20. The gas dispersion disk 20 functions as a selective barrier and is thus effective to counteract gradient pressures existing below such disk and to provide a uniform flow of vapors through the shower head 28 for distribution over the entire surface of the slice 40. In this respect, the gas dispersion disk 20 separates the plasma reaction chamber into a gas inlet section and a slice processing section. The gases passing from the inlet section, which section is typically characterized as having gas pressure gradients, is transformed by the gas dispersion disk 20 into uniform gas pressures which are applied to the slice 40. The vapor gases are then removed from the reaction chamber through the apertured annular ring 38, as noted.

Figure 2:
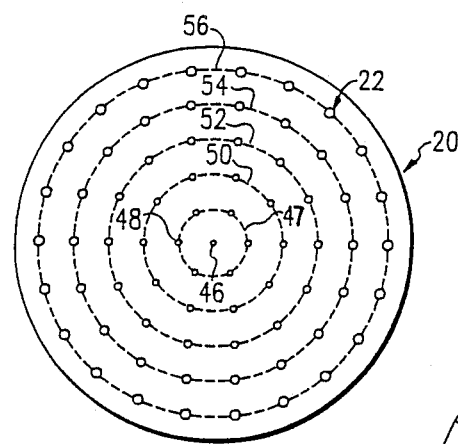
FIG. 2 illustrates a plan view of a gas dispersion disk according to the invention.

FIG. 2 is a plan view of the gas dispersion disk 20. As noted above, the gas dispersion disk 20 includes an arrangement of apertures 22 which are tailored to the particular pressure gradients existing within the reactor chamber to thereby provide a uniform flow of gas vapors to the semiconductor slice 40. With a uniform exposure to the various gas vapors to the slice 40, uniform layers of materials, such as silicon dioxides, silicon nitrides, and other conductive and nonconductive materials can be deposited with very precise layer thicknesses at any location on the slice 40.

The technical advantage of such a gas dispersion disk 20 allows uniform layers of materials having thicknesses of several hundred angstroms to be deposited or removed at any location on the slice 40. This is particularly important in current semiconductor fabrication techniques where the semiconductor circuits are scaled to achieve smaller circuits which require correspondingly thinner layers of various materials. Moreover, with the ability to construct material layers of uniform thickness anywhere on the surface of the slice 40, the circuits, or chips, located near the periphery of the slice 40 are substantially identical in construction and operating characteristics to those circuits located near the center of the semiconductor slice 40. The overall operating characteristics of all circuits on the slice are thereby made more uniform and thus more predictable and reliable as to operation.

The gas dispersion disk 20 is effective to correct nonuniform process results by radially varying gas flow on the output side of the electrode 10. The gas dispersion disk 20 of FIG. 2 includes apertures formed in concentric circles, rather than in uniform rectangular spacings, as heretofore known in the art. Although five concentric circles of aperture groups are shown, such particular number or arrangement is not necessary to the utilization of the invention. Importantly, the gas dispersion disk 20 has formed therein apertures 22 having a certain aperture area per unit of disk area, which ratio increases radially outwardly toward the peripheral edge of disk 20. In other words, the aperture area per unit of disk area near the center of the gas dispersion disk 20 is less than the corresponding ratio near the outer edge of the disk 20. This arrangement corrects gas distribution in reactors having high gas pressures near the center thereof, and descreasing gas pressures near the outer edge of the reactor chamber.

There are generally three primary techniques for providing a varying aperture area to disk area in the gas dispersion disk 20. First, the holes can be formed in groups, each group being associated with a concentric circle on the disk 20, and each hole having substantially the same area or diameter. For varying the aperture area, the concentric circles 47 are uniformly spaced apart, but the apertures in each concentric circle are closer together in the concentric circles located near the periphery of the gas dispersion disk 20. As an alternative, rather than forming the apertures closer together in each concentric circle, the holes in outlying groups can be made of a larger diameter. Also, the ratio of aperture area to unit area of the disk 20 can be varied by increasing the number of concentric circles near the periphery of the gas dispersion disk 20. Those skilled in the art may find that other aperture patterns or arrangements may be advantageous for realizing the principles and concepts of the invention.

As noted above, the gas dispersion disk 20 according to the preferred embodiment of the invention is constructed to counteract pressure gradients having profile characteristics with a greater pressure near the center of the disk 20 and with decreasing pressures near the periphery of the disk 20. To that end, the gas dispersion disk 20 shown in FIG. 2 includes a central aperture 46 of about 0.016 inch in diameter. Each aperture 48 associated with concentric circle 47 is formed with a diameter of about 0.020 inch. The holes associated with concentric circle 50 each have a diameter of about 0.026 inch. In like manner, each hole associated with concentric circle 52 has a diameter of about 0.031 inch. The holes located in concentric circle 54, which are near the peripheral edge of the gas dispersion disk 20, each have a larger diameter, e.g., 0.040 inch. Lastly, the holes associated with the outermost concentric circle 56 are characterized by a diameter of about 0.043 inch. As can be seen, while the holes associated with each concentric circle are spaced apart from each other about the same distance, each group of holes are of different diameters.

Figure 4:
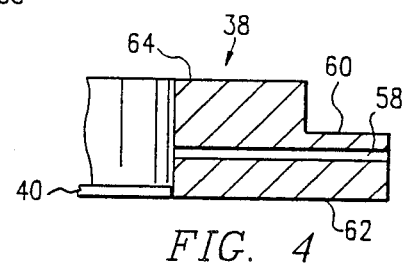
FIG. 4 is a sectional view of the annular apertured ring, taken along line 4—4 of FIG. 3.
Figure 3:
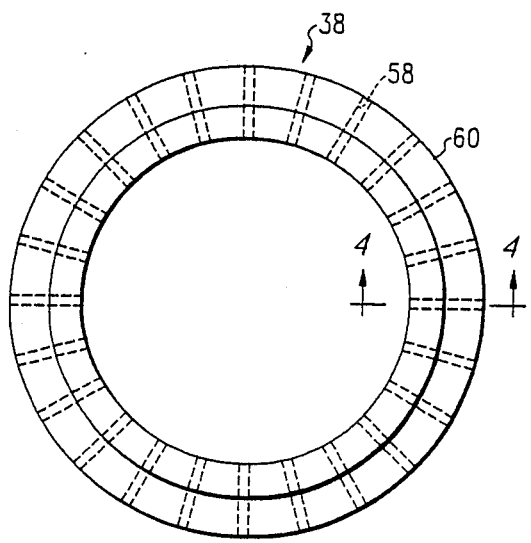
FIG. 3 is a top view of an apertured annular ring for use in evacuating plasma gases from the reaction chamber.

As noted above, the gas dispersion capabilities of the disk 20 are enhanced by the apertured annular ring 38, a top view of which is shown in FIG. 3. The apertured annular ring 38 includes a number of exhaust ports 58 spaced equidistantly about the ring. For reactors adapted for processing four inch slices, the apertured annular ring 38 is constructed with seventy-two such exhaust ports, each having a diameter of about 0.093 inch. The apertured annular ring 38 itself is stepped, with an annular relief 60 formed in the upper annular corner thereof. The details of such construction is shown in FIG. 4. The cylindrical collimator 44 is fitted over the reactor chamber apparatus, thereby enclosing the same, and rests on the relief 60 of the apertured annular ring 38.

As can be seen from FIG. 1, the apertured annular ring 38 has an outside diameter somewhat larger than the apparatus above it, and thus the cylindrical collimator 44 can be lowered over such apparatus to rest on the relief 60 of the apertured annular ring 38. The exhaust ports 58 extend through the radially wider part 62 of the ring 38 which, for four inch slices, has an outside diameter of 5.28 inches and an inside diameter of 4.34 inches. The outside diameter of the diametrically narrower part 64 of the ring 38 is 4.80 inches. With these dimensions, a four inch slice 40 can be easily accommodated therein, without leaving substantial additional peripheral area where undesired deposits of material can occur.

With the provision of the apertured annular ring 38, in conjunction with the gas dispersion disk 20, a more uniform reactive gas pressure is maintained across the plasma volume which exists adjacent the upper surface of the slice 40. The exhaust ports 58 in the apertured annular ring 38 function to provide a flow resistance to the plasma gases within the chamber portion adjacent the slice 40, and thus induce a uniform plasma gas pressure across the slice 40. Uniformity of material layer thickness is thereby enhanced.

In the preferred embodiment of the invention, the apertured annular ring 38 is constructed with a dielectric material, such as a quartz, ceramic, anodized aluminum or other material capable of withstanding high temperatures typically found in semiconductor processing. In order to accommodate the processing of semiconductor slices of diameters smaller than the conventional four inch slice, the apertured annular ring 38 can be made with a smaller inside diameter, but with the same outside diameters noted above. With this construction, different size slices can be processed in the same reactor by changing only the central opening in the apertured annular ring 38. Also, any accumulation of deposition material on the ring 38 can be easily removed, without the time consuming chore of disassembling the reactor components, which was frequently required in well known reactors.

Figure 6:
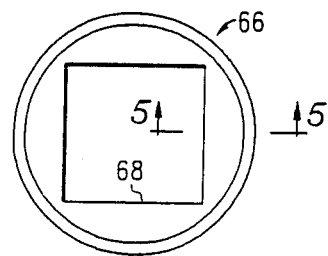
FIG. 6 is a plan view of a annular apertured ring constructed for masking certain areas of the slice.
Figure 5:
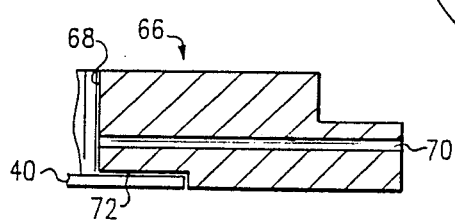
FIG. 5 is a sectional view of an annular apertured ring, taken along line 5—5 of FIG. 6, and constructed in accordance with another embodiment of the invention.

There is illustrated in FIGS. 5 and 6 another embodiment of the apertured annular ring of the invention. Shown is an apertured annular ring 66 having a reduced-size central mask opening 68 which is effective to mask a portion of the slice 40 to prevent the deposition or etching of material therefrom. The central mask opening 68 is illustrated as being square, for exposing a corresponding square surface on the underlying slice 40. The plasma reaction gases are effective to react with only the exposed slice surface, and thereby deposit or etch such area. Of course, openings of other shapes can be employed to selectively deposit or etch specific surface areas of the underlying slice 40.

As noted in FIG. 5, the apertured annular ring 66 includes the radially arranged exhaust ports 70, and an undercut area 72 on the bottom surface thereof for receiving a portion of the slice 40 to be covered. The undercut area 72 is preferably slightly deeper than the thickness of the slice 40 to prevent the plasma gases from reacting with the slice 40 in the undercut area 72.

Figure 7:
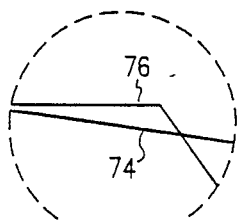

Referring now to FIG. 7, there is shown in graphically form deposition profiles of the various annular apertured ring embodiments of the invention. Such graph depicts the deposition profiles of different apertured annular rings having various inside diameter openings. The inside diameter of the opening is an important aspect of the invention, in that by providing rings with different dimensioned openings, the plasma reaction area can be varied without major hardware changes in the plasma system. A major advantage of this aspect is that plasma equipment manufacturers can supply single slice reactors which are capable of processing slices of different sizes, with a minimal amount of additional cost for hardware changes.

Figure 8:
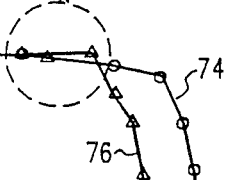
FIGS. 7 and 8 graphically depict various chemical vapor deposition material profiles for different central opening apertures in the annular apertured ring.

The experimental results shown in FIG. 7 were derived from tests performed in a single slice plasma enhanced chemical vapor deposition oxide reactor. The horizontal axis of the graph indicates radially distance from the center of the slice, while the vertical axis indicates deposited film thickness in angstroms. Line 74 of the graph is illustrative of the deposition thickness when four-inch slices were subjected to plasma reactions, without the benefit of an apertured annular ring. Line 76 depicts the deposition profile using an apertured annular ring of the invention having a 4.3 inside diameter opening. As can be seen in the enlarged view of FIG. 8, the provision of the apertured annular ring results in a more uniform deposition thickness of material proximate the edges of the slice. Without the ring, line 74 indicates that the thickness drops off significantly, about 500 angstroms, as compared to the deposition thickness with the apertured annular ring, as shown by line 76. Such a thickness can significantly effect the electrical properties of circuits formed in chips lying near the edge of the slice.

Importantly, silicon oxide film uniformity from a nonapertured ring to an apertured ring of 4.3 inch central opening, changed from 10.4% to 3.6%. A significant improvement is apparent, with no other deposition parameters varied during the test.

Line 78 of the graph illustrates a central opening of 2.5 inches. In other words, an apertured annular ring, similar to that shown in FIGS. 5 and 6 was utilized with a 2.5 inch circular central opening. With such a ring, substantially no deposit existed beyond the opening, but rather stopped abruptly at the edge of the ring opening. The tests utilizing an apertured annular ring having a central opening of 2.5 inch, and a square opening, demonstrate the capability of the aperture to be employed as a method of controlling and shaping the plasma volume.

Experimental results also indicate that the quality of the deposited film using an apertured annular ring is improved over that of deposits utilizing a reactor with no apertured ring.

From the foregoing, disclosed is plasma reactor apparatus which allows correction of the nonuniformities in gas vapor pressures existing within a chemical vapor transport system, and which provides the capability of processing different size slices. This is accomplished by altering the gas flow over the slice in such a manner as to counteract the pressure gradients which are inherent in single slice chemical vapor transport reactors. By utilizing a family of annular rings with different central opening sizes, various sizes of semiconductor slices can be processed using the same plasma reactor.

While the embodiments of the methods and apparatus have been disclosed with reference to specific structures, it is to be understood that many changes in detail may be made as a matter of engineering choices without departing from the spirit and scope of the invention as defined by the appended claims.

What is claimed is:

1. Apparatus adapted for use with a plasma reactor of the type having a reaction chamber for dispensing a gas, and a semiconductor slice holder for subjecting a semiconductor slice to the gas, comprising:
   a ring having an outside dimension for engaging a sidewall of the reaction chamber, an inside dimension defining a central opening aperture for receiving therein and laterally confining the semiconductor slice.

2. The apparatus of claim 1, wherein said ring includes a plurality of exhaust ports for exhausting the gas from the reaction chamber.

3. The apparatus of claim 2, wherein said ring is annular shaped with said exhaust ports spaced therearound.

4. The apparatus of claim 1, wherein said ring is an insulator which does not support a plasma reaction.

5. The apparatus of claim 1, wherein said reaction chamber apparatus includes a cylindrical collimator, and wherein said ring includes an annular relief for receiving therein said collimator.

6. The apparatus of claim 1, wherein said ring incldes a central mask opening which covers at least a portion of said slice to prevent said gases from reaching said portion.

7. The apparatus of claim 6, wherein said ring includes a recessed area therein for laterally supporting said slice while yet covering a portion of said slice.

8. The apparatus of claim 6, wherein said control mask opening includes a square mask opening.

9. The apparatus of claim 8, wherein said central opening aperture is annular shaped for supporting a round slice therein.

10. The apparatus of claim 1, further including a plurality of said rings, each including a different sized central opening aperture for supporting therein a different sized slice.

11. Apparatus for use with a plasma reactor of the type for processing semiconductor slices, comprising:
   a reaction chamber for generating a plasma reaction;
   an inlet for inputting a gas into said chamber;
   a support ring for laterally supporting a slice within said chamber, said ring having a plurality of ports for exhausting the gas from said chamber at a plane above said slice, said ports being sized to produce a back pressure in said chamber to thereby enhance uniformity of material deposition as a result of said plasma reaction.

12. The apparatus of claim 11, wherein said ring includes an annular part for spacing said slice from a sidewall of said chamber.

13. The apparatus of claim 12, further including a plurality of said rings, each ring having a different radial width of said annular part to accommodate slices of different diameters.

14. The apparatus of claim 11, wherein said ring is electrically insulating.

15. The apparatus of claim 14, wherein said annular ring includes a mask opening of a different size than a central opening aperture, and said mask opening being smaller than a surface area of the slice.

16. Apparatus adapted for use with a plasma reactor of the type having a reaction chamber for dispensing a gas, and a semiconductor slice holder for subjecting a semiconductor slice to the gas, comprising:
   an electrically insulating ring providing a space between the slice and a sidewall of said chamber, said ring having a plurality of exhaust ports spaced therearound for exhausting gas from an area above said slice to the outside of said chamber.

17. The apparatus of claim 16, wherein said ring includes an annular central opening for laterally retaining said slice within said chamber, and a mask opening for masking a portion of said slice to prevent said gases from reaching said slice.

18. The apparatus of claim 16, wherein said ring is constructed of a material which does not support a plasma reaction and thus substantially no plasma reaction deposits form on said ring.

* * * * *